(12) United States Patent
Chang et al.

(10) Patent No.: US 9,093,576 B2
(45) Date of Patent: Jul. 28, 2015

(54) IMAGE SENSOR COMPRISING A DIGITAL-ALLOY MICROLENS ARRAY INTEGRATED WITH SENSOR ARRAY, AND MANUFACTURING METHOD THEREOF

(71) Applicant: KOREA BASIC SCIENCE INSTITUTE, Daejeon (KR)

(72) Inventors: Ki Soo Chang, Daejeon (KR); Geon Hee Kim, Daejeon (KR); Sun Cheol Yang, Daejeon (KR); Hyo Sik Kim, Daejeon (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 0 days.

(21) Appl. No.: 14/056,915

(22) Filed: Oct. 17, 2013

(65) Prior Publication Data

US 2014/0042579 A1 Feb. 13, 2014

Related U.S. Application Data

(62) Division of application No. 13/133,940, filed as application No. PCT/KR2009/006442 on Nov. 4, 2009, now abandoned.

(30) Foreign Application Priority Data

Dec. 11, 2008 (KR) .................. 10-2008-0126145

(51) Int. Cl.
*H01L 21/00* (2006.01)
*H01L 31/0232* (2014.01)
(Continued)

(52) U.S. Cl.
CPC ...... *H01L 31/0232* (2013.01); *B29D 11/00365* (2013.01); *B29D 11/00807* (2013.01);
(Continued)

(58) Field of Classification Search
CPC .............. H01L 31/02327; H01L 31/0232; H01L 27/14627; H01L 27/14685

USPC ............................................ 257/467; 438/69
See application file for complete search history.

(56) References Cited

U.S. PATENT DOCUMENTS 5,633,527 A 5/1997 Lear
5,701,008 A 12/1997 Ray et al.
(Continued)

FOREIGN PATENT DOCUMENTS

JP 10-239157 A 9/1998
JP 2002-214404 A 7/2002
WO 2007/061271 A1 5/2007

OTHER PUBLICATIONS

International Search Report for PCT/KR2009/006442 dated Jun. 23, 2010.
(Continued)

*Primary Examiner* — Caleb Henry
*Assistant Examiner* — Alexander Belousov
(74) *Attorney, Agent, or Firm* — Nixon Peabody LLP; Joseph Bach, Esq.

(57) ABSTRACT

The present invention relates to an image sensor comprising a microlens array, and to a manufacturing method thereof. The method of the present invention includes gradually increasing the aluminum composition ratio of a compound semiconductor as the latter gradually gets farther from a substrate, to enable a microlens-forming layer to grow, and making the oxidation rate of the region adjacent to the substrate slower and the oxidation rate of the region farther from the substrate faster, making the interface between the oxidized region and the unoxidized region into a lens shape after the completion of oxidation. The thus-made lens is integrated into an image sensor. The present invention reduces costs for manufacturing image sensors in which a microlens is integrated, increases the signal-to-noise ratio and resolution of the image sensor, and achieves improved sensitivity.

10 Claims, 9 Drawing Sheets

(51) Int. Cl.
*B29D 11/00* (2006.01)
*H01L 27/146* (2006.01)
*H01L 31/18* (2006.01)

(52) U.S. Cl.
CPC .... *H01L27/14627* (2013.01); *H01L 27/14685* (2013.01); *H01L 31/18* (2013.01); *H01L 31/02327* (2013.01)

(56) References Cited

U.S. PATENT DOCUMENTS

| | | | |
|---|---|---|---|
| 6,728,289 | B1 | 4/2004 | Peake et al. |
| 7,148,464 | B2 * | 12/2006 | Shibayama ................ 250/214.1 |
| 7,294,896 | B2 * | 11/2007 | Lee ................................ 257/432 |
| 2009/0068775 | A1 * | 3/2009 | Chang et al. ..................... 438/29 |

OTHER PUBLICATIONS

Restriction Requirement for U.S. Appl. No. 13/133,940, mailed on Jul. 16, 2012.

Office Action for U.S. Appl. No. 13/133,940, mailed on Oct. 18, 2012.

Office Action for U.S. Appl. No. 13/133,940, mailed on Apr. 18, 2013.

* cited by examiner

IMAGE SENSOR COMPRISING A DIGITAL-ALLOY MICROLENS ARRAY INTEGRATED WITH SENSOR ARRAY, AND MANUFACTURING METHOD THEREOF

CROSS-REFERENCE TO RELATED APPLICATIONS

This application is a divisional application of U.S. application Ser. No. 13/133,940, filed on Aug. 9, 2011, which is a National Phase of International Application No. PCT/KR2009/006442, filed on Nov. 4, 2009, and which claims priority to and the benefit of Korean Patent Application No. 10-2008-0126145, filed on Dec. 11, 2008, and the disclosures of which are hereby incorporated herein by reference in their entireties.

BACKGROUND

1. Field of the Invention

The present invention relates to an image sensor including a microlens array and a method of manufacturing the same, and more particularly, to an image sensor including a microlens array and a method of manufacturing the same, by which a lens may be manufactured using a semiconductor material. The method enables a lens to be monolithic or hybrid integrated with an image sensor, which makes the image sensor have a high numerical aperture (NA), a subminiature, high-density, polygonal microlens array.

2. Discussion of Related Art

Generally, the improvement of signal-to-noise ratios (SNR), resolution, and sensitivity has become an important issue in developments of image sensors, particularly, high-performance infrared (IR) image sensors.

A main cause of a noise of an IR image sensor may be a dark current. Since the dark current is linearly proportional to the area of the photodetector, a photodetection region should be reduced to improve an SNR.

In addition, since the number of pixels per unit area should be increased to improve the resolution of an image sensor, the area of each pixel including a photodetection region should be reduced.

However, a reduction in the photodetection region may lead to a reduction in the amount of light received by a photodetector, which may bring about a reduction in the light reception efficiency of the photodetector, thus resulting in a drop in the sensitivity of the image sensor.

Thus, a microlens array including a plurality of microlenses may be formed on an image sensor. The microlens array, which may focus light incident to a pixel on a small photodetection region of the pixel, may function to effectively increase the amount of light incident to a photodetector even if the photodetection region is reduced.

Accordingly, many methods of manufacturing a microlens array integrated in an image sensor have been proposed thus far. A representative method of manufacturing an image sensor including a microlens array may include reflowing a polymer.

A method of reflowing polymer may include forming a transparent predeposition layer on a substrate including an image sensor, forming photoresist patterns for a plurality of microlenses on the transparent predeposition layer, and reflowing the photoresist patterns by heating. As a result, since the polymer tends to have a globular surface due to surface tension, a microlens array having a predetermined radius of curvature may be formed.

However, each of the microlenses formed using the above-described reflow method may have a naturally circular shape, and thus the fill factor of the microlens array (i.e., a ratio of the area of the microlens to that of a square unit pixel region or unit cell region of the microlens array) may be limited to 78% or lower.

That is, at least 22% of light incident to each of square pixels may be incident to a region where no microlens is formed. Accordingly, at least 22% of the light incident to each of the pixels may not be focused on the photodetection region but be lost without contributing to forming images.

Furthermore, since a method of manufacturing a microlens array using the reflow of a polymer was performed using surface tension, it was difficult to control the radius of curvature or focal distance of the microlens, which doesn't allow a high-density of microlens array.

SUMMARY OF THE INVENTION

The present invention is directed to an image sensor including a microlens array and a method of manufacturing the same, which facilitate controlling the radius of curvature or focal distance of microlenses and enable the manufacture of not only circular microlenses but also polygonal microlenses.

The present invention is also directed to an image sensor including a microlens array and a method of manufacturing the same, which may reduce costs for manufacturing image sensors, increase the signal-to-noise ratio (SNR) and resolution of the image sensors, and improve the sensitivity thereof.

According to an aspect of the present invention, there is provided an image sensor including a microlens array, including: a substrate having one side on which a plurality of photo-detectors configured to sense light are formed; and a plurality of microlenses disposed on the other side of the substrate and spaced a predetermined distance apart from one another, the plurality of microlenses respectively corresponding to the plurality of photo-detectors and configured to focus external light and allow the light to be incident to the photo-detectors. Each of the microlenses includes a lens-shaped semiconductor material layer stacked such that an oxidation rate of the semiconductor material layer gradually increases as the semiconductor material layer becomes farther from the substrate.

Each of the microlenses may be formed by selectively oxidizing the semiconductor material layer.

Each of the microlenses may include a plurality of different layers, each of the plurality of layers may include a digital alloy formed by stacking at least two semiconductor material layers having different oxidation rates, and the thickness of a layer having a highest oxidation rate out of the at least two semiconductor material layers may increase as the semiconductor material layer becomes farther from the substrate.

The semiconductor material layer may include a combination of an aluminum (Al)-containing ternary or quaternary compound and is formed by stacking an Al-containing binary or ternary compound and an Al-free binary or ternary compound.

The semiconductor material layer may include any one compound combination selected from aluminum gallium arsenide (AlGaAs), aluminum gallium nitride (AlGaN), indium gallium aluminum nitride (InGaAlN), indium gallium aluminum arsenide (InGaAlAs) or indium gallium aluminum phosphide (InGaAlP).

A horizontal section of each of the microlenses may have a circular or polygonal shape.

Each of the microlenses may be a spheric or aspheric lens.

A central portion of each of the microlenses may have a height of about 1 to about 2 µm.

According to another aspect of the present invention, there is provided an image sensor including a microlens array, including: a microbolometer disposed on a first substrate and including a plurality of thermal detectors configured to sense heat generated by infrared (IR) light; and a microlens array including a plurality of microlenses formed on one side of a second substrate, the plurality of microlenses configured to focus external light incident from the other side of the second substrate and allow the external light to be incident to each of the thermal detectors. The microbolometer and the microlens array are hybrid-integrated with each other such that the microlenses are respectively spaced a predetermined distance apart from and opposite to the corresponding thermal detectors.

Each of the microlenses may include a lens-shaped semiconductor material layer stacked such that an oxidation rate of the semiconductor material layer gradually increases as the semiconductor material layer becomes farther from the second substrate.

According to another aspect of the present invention, there is provided a method of manufacturing an image sensor including a microlens array, the method including: (a) forming a microlens-forming layer on one side of a substrate by stacking a semiconductor material layer whose oxidation rate is gradually increased as the semiconductor material layer becomes farther from the substrate; (b) forming a plurality of mesa structures by etching a predetermined region of the microlens-forming layer until the substrate is exposed, the plurality of mesa structures spaced a predetermined distance apart from one another and having exposed lateral surfaces, respectively; (c) oxidizing a lateral surface of each of the mesa structures while increasing an oxidation rate as each of the mesa structures becomes farther from the substrate to make an interface between an oxidized region and an unoxidized region into a lens shape after completion of oxidation to form microlenses having a radius of curvature in the centers of the respective mesa structures and selectively removing other oxidized regions than the microlenses; and (d) forming a plurality of photo-detectors on the other side of the substrate to respectively correspond to the microlenses.

After step (a), the method may further include forming an oxidation barrier layer on a top surface of the microlens-forming layer to a predetermined thickness.

In step (a), the microlens-forming layer may be formed using a plurality of different layers. Each of the plurality of layers may include a digital alloy formed by stacking at least two semiconductor material layers having different oxidation rates, and an oxidation rate of each of the plurality of layers may be gradually increased by controlling the thickness of a layer having a highest oxidation rate out of the at least two semiconductor material layers having the different oxidation rates.

In step (a), the microlens-forming layer may include a combination of an Al-containing ternary or quaternary compound and be formed by alternately stacking an Al-containing binary or ternary compound and an Al-free binary or ternary compound.

In step (b), each of the mesa structures may be formed as a circular or polygonal mesa structure.

In step (c), each of the microlenses may be formed in a lens shape having a radius of curvature by exponentially oxidizing the microlens-forming layer according to the oxidation rate of the semiconductor material layer stacked by gradually increasing the oxidation rate in the microlens-forming layer.

In step (c), the oxidation of the lateral surface of each of the mesa structures may be performed using a wet oxidation process at a temperature of about 300 to about 500° C. for about 30 to about 200 minutes.

According to another aspect of the present invention, there is provided a method of manufacturing an image sensor including a microlens array, the method including: (a') manufacturing a microbolometer on a first substrate, the microbolometer including a plurality of thermal detectors configured to sense heat generated by IR light; (b') manufacturing a microlens array including a plurality of microlenses on one side of a second substrate, the plurality of microlenses configured to focus external light incident from the other side of the second substrate and allow the external light to be incident to each of the thermal detectors; and (c') hybrid-integrating the separately manufactured microbolometer and microlens array such that the thermal detectors are respectively disposed a predetermined distance apart from and opposite to the corresponding microlenses.

Step (b') may include: (b'-1) forming a microlens-forming layer on one side of the second substrate by stacking a semiconductor material layer whose oxidation rate is gradually increased as the semiconductor material layer becomes farther from the second substrate; (b'-2) etching a predetermined region of the microlens-forming layer until the second substrate is exposed to form a plurality of mesa structures spaced a predetermined distance apart from one another and having exposed lateral surfaces; and (b'-3) oxidizing a lateral surface of each of the mesa structures while increasing an oxidation rate as each of the mesa structures becomes farther from the second substrate to make an interface between an oxidized region and an unoxidized region into a lens shape after completion of oxidation to form microlenses having a radius of curvature in the centers of the respective mesa structures and selectively removing other oxidized regions than the microlenses.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Various exemplary embodiments of the present invention will now be described more fully with reference to the accompanying drawings in which some exemplary embodiments are shown. This invention may, however, be embodied in different forms and should not be construed as limited to the embodiments set forth herein. Rather, these embodiments are provided so that this disclosure is thorough and complete and fully conveys the scope of the present invention to one skilled in the art.

Figure 1:
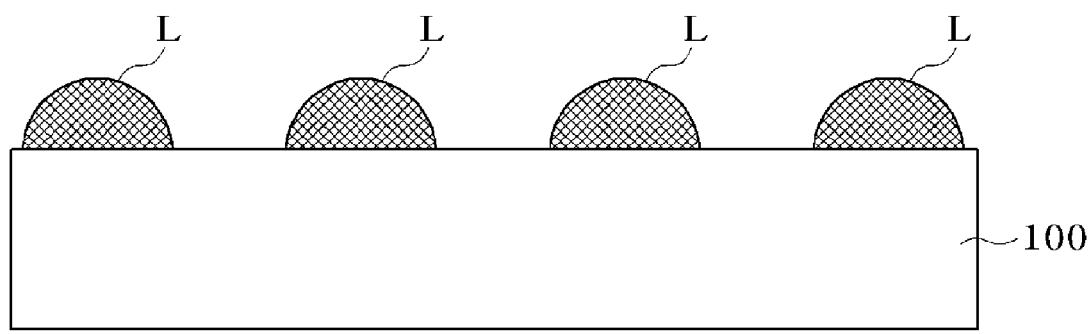
FIG. 1 is a cross-sectional view of a microlens according to an exemplary embodiment of the present invention.
Figure 2:
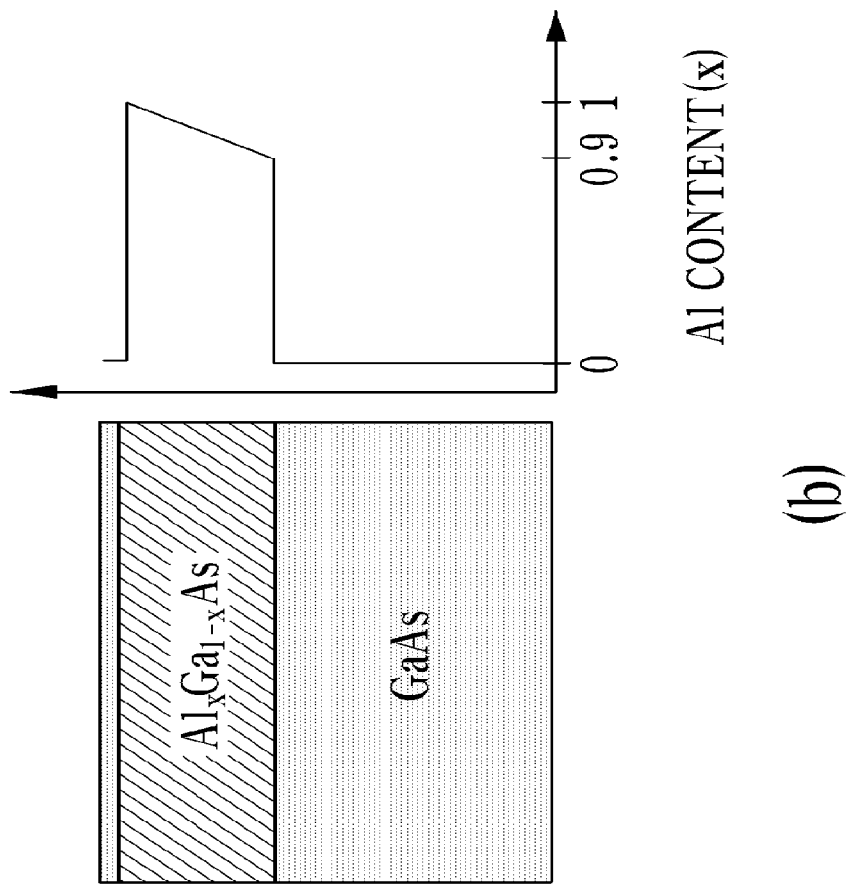
FIG. 2 is a graph showing an aluminum (Al) content and oxidation rate, which illustrates a method of forming a microlens using an analog alloy process.
Figure 2:
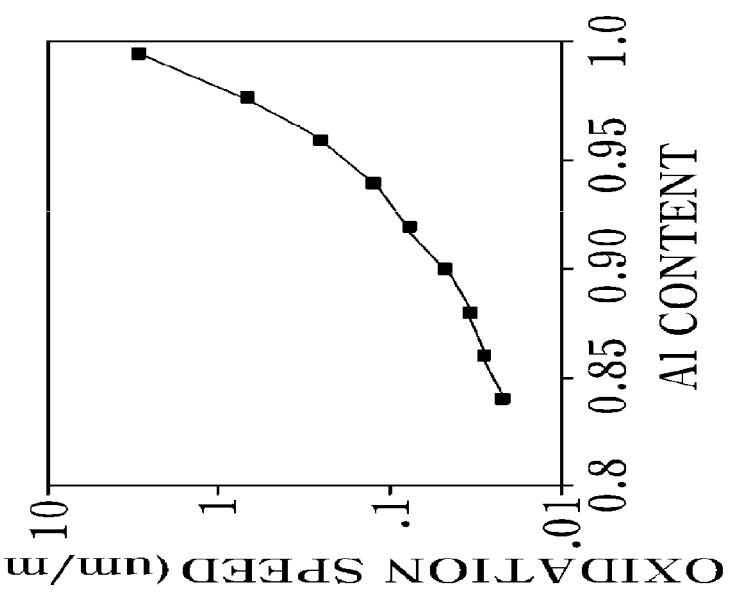
Figure 3:
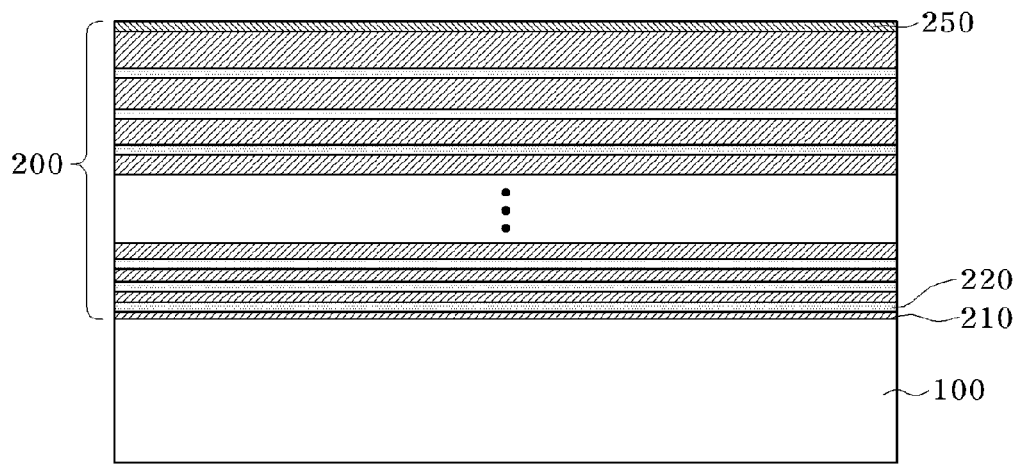
FIGS. 3 and 4 are cross-sectional views illustrating a method of forming a microlens using a digital alloy process.
Figure 4:
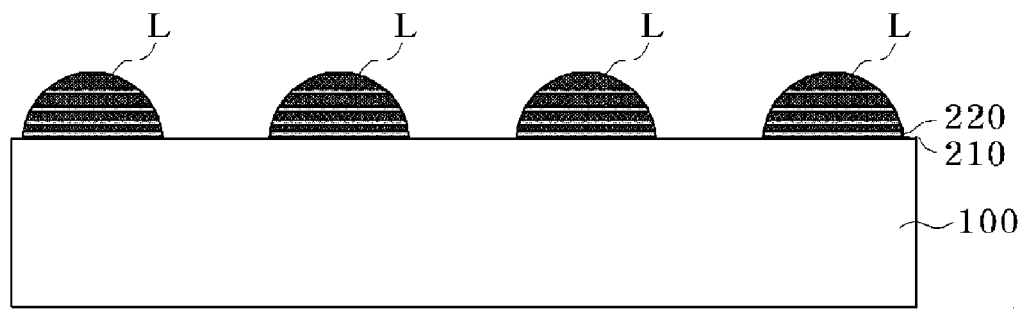

FIG. 1 is a cross-sectional view of a microlens according to an exemplary embodiment of the present invention, FIG. 2 is a graph showing an aluminum (Al) content and oxidation rate, which illustrates a method of forming a microlens using an analog alloy process, and FIGS. 3 and 4 are cross-sectional views illustrating a method of forming a microlens using a digital alloy process.

Referring to FIG. 1, a microlens L according to an exemplary embodiment of the present invention may be formed on a prepared substrate 100. For example, a predetermined microlens array may be formed using a combination of a plurality of microlenses L.

Each of the microlenses L may include a semiconductor material layer stacked by gradually increasing an oxidation rate as the corresponding microlens L becomes farther from the substrate 100. Each of the microlenses L may be formed by selectively oxidizing the semiconductor material layer.

For example, the oxidation rate of the semiconductor material layer may depend on the Al composition ratio thereof. The formation of the microlens L may include gradually increasing the Al composition ratio of the semiconductor material layer as the microlens L becomes farther from the substrate 100 to increase the oxidation rate according to the Al composition ratio as the microlens L becomes farther from the substrate 100. Thus, after completion of oxidation, an interface between an oxidized region and an unoxidized region may form a lens shape.

In this case, a method of forming the semiconductor material layer constituting the microlens L may be performed using, for example, an analog alloy process or a digital alloy process, but the present invention is not limited thereto.

Referring to FIGS. 1 and 2, initially, the analog alloy process may include growing the semiconductor material layer for the microlens L while gradually increasing, for example, the amount of Al, to gradually increase the oxidation rate of the semiconductor material layer. When the Al content is gradually increased as shown in FIG. 2, the oxidation rate of the semiconductor material layer may be exponentially increased so that the interface between the oxidized region and the unoxidized region can naturally assume a lens shape during the oxidation of the semiconductor material layer.

Referring to FIGS. 3 and 4, in the digital alloy process, the microlens L may be formed of, for example, a multinary compound semiconductor material. Unit compound semiconductor materials of the multinary compound semiconductor material may be alternately stacked and oxidized to form a lens shape.

A method of manufacturing the microlens L using the digital alloy process according to an exemplary embodiment of the present invention will now be described in further detail. Referring to FIG. 3, a predetermined microlens-forming layer 200 for the microlens L may be deposited on a prepared substrate 100.

The microlens-forming layer 200 may include, for example, a plurality of different layers as shown in FIG. 3. Each of the plurality of layers may include at least two semiconductor material layers having different oxidation rates, for example, a high-oxidation-rate layer 210 having a high Al content and a low-oxidation-rate layer 220 having a low Al content. Each of the plurality of layers may be formed by alternately stacking the high-oxidation-rate layer 210 and the low-oxidation-rate layer 220. Naturally, each of the plurality of layers may include three different layers, but the present invention is not limited thereto.

For example, the semiconductor material layer may be formed of an Al-containing ternary compound (e.g., aluminum gallium arsenide (AlGaAs)) or an Al-containing quaternary compound (e.g., indium gallium aluminum arsenide (InGaAlAs) or indium gallium aluminum phosphide (InGaAlP)). When the semiconductor material layer is a ternary semiconductor material layer, for example, an AlGaAs semiconductor material layer, the AlGaAs semiconductor material layer may be generally formed by alternately stacking, for example, an Al-containing binary compound layer (i.e., an AlAs compound layer) and an Al-free binary compound layer (i.e., a GaAs compound layer) to a small thickness.

In addition, when the semiconductor material layer is a quaternary semiconductor material layer, for example, an InGaAlAs semiconductor material layer, the InGaAlAs semiconductor material layer may be formed by stacking an Al-containing InAlAs compound layer and an Al-free InGaAs compound layer. Also, when the semiconductor material layer is, for example, an InGaAlP compound layer, the InGaAlP compound layer may be formed by stacking an Al-containing InAlP compound layer and an Al-free InGaP compound layer.

In this case, as the high-oxidation-rate layer 210 gets farther from the substrate 100, the thickness of the high-oxidation-rate layer 210 of the semiconductor material layer may increase in order for the average Al content of the semiconductor material layer of the microlens-forming layer 200 to increase as the semiconductor material layer of the microlens-forming layer 200 becomes farther from the substrate 100.

That is, when the semiconductor material layer is a ternary semiconductor material layer, for example, an AlGaAs semiconductor material layer, the AlGaAs semiconductor material layer may be formed by alternately stacking an AlAs compound layer and a GaAs compound layer as described above. In this case, an $Al_{0.9}Ga_{0.1}As$ layer may be formed by stacking an AlAs layer and a GaAs layer in a thickness ratio of, for example, 90 to 10, while an $Al_{0.99}Ga_{0.01}As$ layer may be formed by stacking an AlAs layer and a GaAs layer in a thickness ratio of, for example, 99 to 1.

For instance, assuming that a composition ratio x of an $Al_xGa_{1-x}As$ layer is intended to increase, for example, from 0.9 to 0.99 in a direction in which the semiconductor material layer is grown, when the AlAs layer and the GaAs layer are alternately stacked, the thickness of the AlAs layer may be gradually increased. Thus, although the AlAs layer and the GaAs layer are minutely repeated, the average composition ratio x of the $Al_xGa_{1-x}As$ layer may increase from 0.9 to 0.99. Naturally, the composition ratio x may be selectively controlled within a wide range, but the present invention is not limited thereto.

Meanwhile, an oxidation barrier layer 250 may be further formed on a top surface of the microlens-forming layer 200 as needed. The oxidation barrier layer 250 may inhibit vertical oxidation of a top portion of the microlens-forming layer 200 and allow only horizontal oxidation of a lateral portion of the microlens-forming layer 200 during subsequent oxidation of the microlens-forming layer 200, thus resulting in formation of a lens shape.

Subsequently, when the microlens-forming layer 200 is oxidized in a lateral direction, the average Al content of the microlens-forming layer 200 may increase toward a top portion thereof, so that the microlens L can be formed as shown in FIG. 4.

In this case, since the low-oxidation-rate layer 220 stacked on the microlens-forming layer 200 is formed to a much smaller thickness than the high-oxidation-rate layer 210, almost all regions of the low-oxidation-rate layer 220 may be simultaneously oxidized along with the oxidation of the high-oxidation-rate layer 210 during the oxidation of the microlens-forming layer 200. As a result, almost all the regions of the microlens-forming layer 200 except a region where the microlens L is formed may be oxidized irrespective of the high-oxidation-rate layer 210 and the low-oxidation-rate layer 220.

Here, the Al-containing high-oxidation-rate layer 210 may be formed to a thickness of, for example, several tens of Å to several hundreds of Å, while the Al-free low-oxidation-rate layer 220 may be formed to a thickness of, for example, about 10 Å.

In addition, the microlens-forming layer 200 may be formed by stacking the high-oxidation-rate layer 210 and the low-oxidation-rate layer 220, for example, about 100 times, but the present invention is not limited thereto.

Meanwhile, a plurality of microlenses L may be formed on the substrate 100, thereby manufacturing a microlens array.

Figure 5:
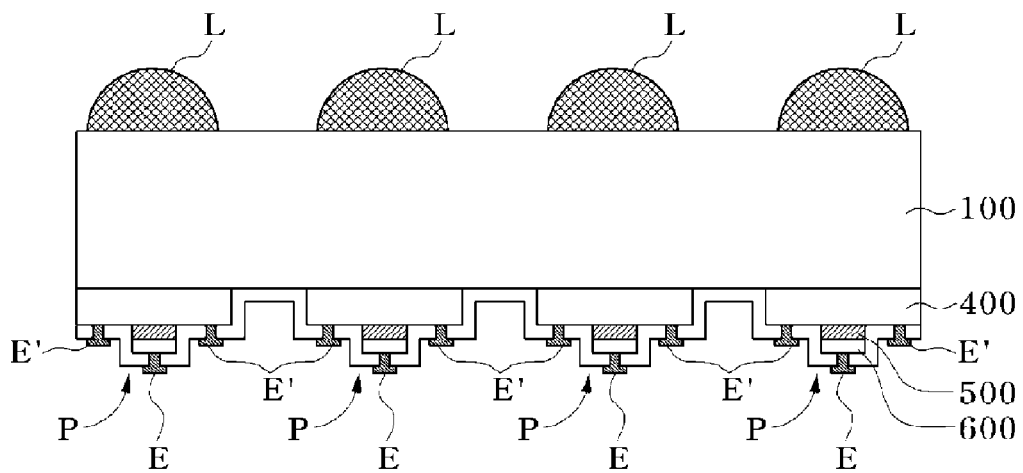
FIG. 5 is a cross-sectional view of an image sensor including a monolithically integrated microlens array according to an exemplary embodiment of the present invention.

FIG. 5 is a cross-sectional view of an image sensor containing a microlens array according to an exemplary embodiment of the present invention.

Referring to FIG. 5, the image sensor containing the microlens array according to the exemplary embodiment of the present invention may include a substrate 100, a plurality of microlenses L formed on one side of the substrate 100, and a plurality of photo-detectors P formed on the other side of the substrate 100.

Here, the substrate 100 may be a semiconductor substrate formed of, for example, GaAs, GaP, InP, InGaAs, sapphire ($Al_2O_3$), or GaN, but the present invention is not limited thereto.

The plurality of microlenses L may be formed on one side of the substrate 100 in positions corresponding to the plurality of photo-detectors P, respectively, thereby forming, for example, a predetermined microlens array.

Each of the microlenses L may be formed of a semiconductor material layer stacked by gradually increasing an oxidation rate as the corresponding microlens L becomes farther from the substrate 100. Each of the microlenses L may be formed by selectively oxidizing the semiconductor material layer.

For instance, the oxidation rate of the semiconductor material layer may depend on the Al composition ratio thereof. The formation of the microlens L may include gradually increasing the Al composition ratio of the semiconductor material layer as the microlens L becomes farther from the substrate 100 to increase the oxidation rate according to the Al composition ratio as the microlens L becomes farther from the substrate 100. Thus, after completion of oxidation, an interface between an oxidized region and an unoxidized region may form a lens shape.

In this case, a method of forming the semiconductor material layer constituting the microlens L may be performed using, for example, an analog alloy process or a digital alloy process, but the present invention is not limited thereto. The analog alloy process and the digital alloy process were described above in detail with reference to FIGS. 2 through 4.

Furthermore, the microlens L may be formed as a spheric lens or aspheric lens by appropriately controlling the oxidation rate (or Al composition ratio) of the semiconductor material layer. A central portion of each of the microlenses L may have a height of, for example, about 1 to 2 μm.

Meanwhile, the photo-detector P may be any apparatus, for example, a photodiode (PD), which may externally receive light and convert the received light into an electric signal.

For example, the photo-detector P applied to one embodiment of the present invention may include a lower ohmic contact layer 400, an active layer 500, an upper ohmic contact layer 600, a passivation layer 700, and upper and lower electrodes E and E', which are formed on a substrate 100, but the present invention is not limited thereto.

In general, the lower ohmic contact layer 400 may include, for example, an n-type doped semiconductor layer, while the upper ohmic contact layer 600 may include, for example, a p-type doped semiconductor layer, but the present invention is not limited thereto.

The passivation layer 700 may be formed using, for example, $SiN_x$, $SiO_2$, or a polymer material.

The upper and lower electrodes E and E' may include, for example, a metal material, such as nickel (Ni), gold (Au), germanium (Ge), platinum (Pt), or titanium (Ti).

In an image sensor containing a microlens array according to an exemplary embodiment of the present invention, a predetermined microlens array including a plurality of microlenses L may be formed on a substrate 100. Thus, light incident to each pixel of each photo-detector P of the image sensor may be focused on a small photodetection region of the pixel to increase the amount of light incident to the photo-detector P. As a result, the SNR and resolution of the image sensor may be increased, and the sensitivity of the image sensor may be improved.

Furthermore, a lens, which may be easily monolithically integrated with an image sensor and have a high NA, may be manufactured, and a subminiature or high-density microlens array may be manufactured, thereby lowering costs for manufacturing high-performance image sensors and improving the performance thereof.

Figure 6:
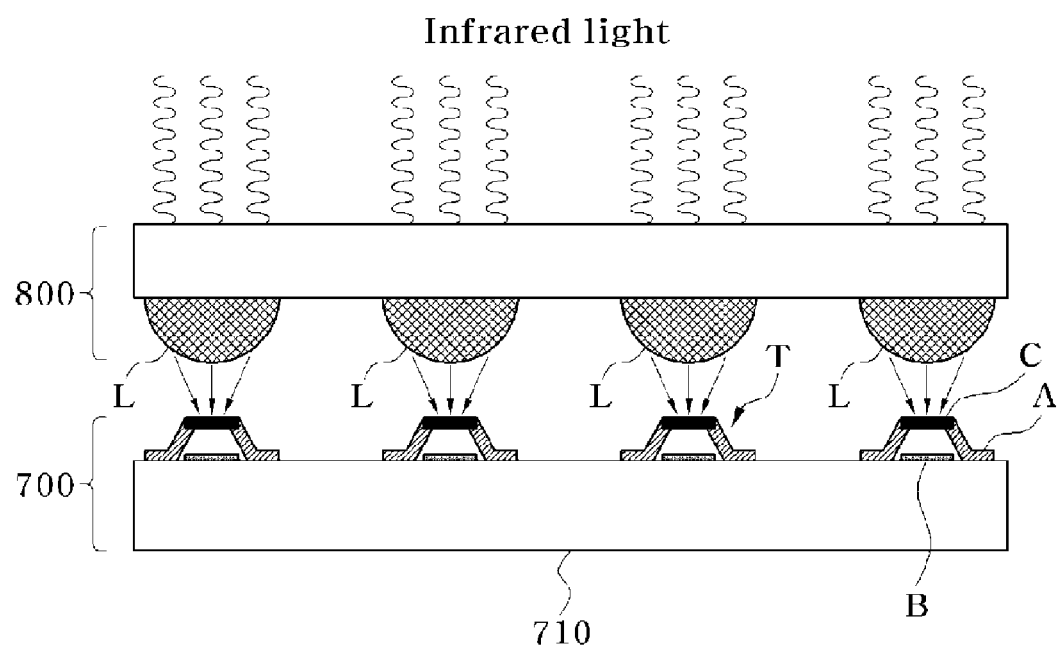
FIG. 6 is a cross-sectional view of a microbolometer infrared (IR) image sensor including a hybrid integrated microlens array according to an exemplary embodiment of the present invention.

FIG. 6 is a cross-sectional view of a microbolometer IR image sensor containing a microlens array according to an exemplary embodiment of the present invention.

Referring to FIG. 6, as compared with FIG. 5 that shows the microlens array formed on one side of the substrate of the image sensor, an image sensor and a microlens array may be monolithically integrated. The image sensor of FIG. 6 is limited to a case where light is incident toward a substrate.

Meanwhile, because a readout integrated circuit (ROIC) is formed on a substrate of an image sensor or for other reasons, a microbolometer IR image sensor 700 in which light is not incident through a substrate but incident from above a detector (i.e., opposite the substrate) may be typically provided.

In this case, the microbolometer IR image sensor 700 may typically include thermal detectors instead of photo-detectors. Thus, the microbolometer IR image sensor 700 may include an array of IR image sensors (i.e., thermal detectors T), and each of the thermal detectors T may include an electrode A, a reflection plate B, and an IR absorption layer C disposed on a substrate 710. In this case, since light is incident not toward the substrate 710 but toward the microbolometer IR image sensor 700, a microlens array 800 according to an exemplary embodiment of the present invention may be formed over the microbolometer IR image sensor 700. In this case, it may be impossible to monolithically integrate the image sensor and the microlens array. Accordingly, as shown in FIG. 6, the microlens array 800 and the microbolometer IR image sensor 800 should be separately manufactured and hybrid-integrated.

Specifically, as shown in FIG. 6, the microlens array 800 and the microbolometer IR image sensor 700 may be separately manufactured such that the IR absorption layer C of each of the thermal detectors T is spaced a predetermined distance apart from the corresponding one of the microlenses L of the microlens array 800. Thereafter, the microlens array 800 and the microbolometer IR image sensor 700 may be hybrid-integrated with each other using, for example, a flip-chip bonding apparatus.

Meanwhile, the structure of the microbolometer IR image sensor 700 applied to one embodiment of the present invention may typically include an array of thermal detectors T, each thermal detector T including the electrode A, the reflection plate B, and the IR absorption layer C formed on the substrate 710. However, the present invention is not limited thereto, and the structure of the microbolometer IR image sensor 700 may have various other shapes.

The microbolometer IR image sensor including the microlens array having the above-described construction may focus external light (i.e., IR light) incident to each of the microlenses L of the microlens array 800 and emit the light to a region of the IR absorption layer C of each of the thermal detectors C to increase the amount of light incident to the thermal detectors T. Thus, the SNR and resolution of the IR image sensor may be increased, and the sensitivity thereof may be improved.

FIGS. 7 through 14 are cross-sectional views illustrating a method of manufacturing an image sensor including a microlens array according to an exemplary embodiment of the present invention.

Figure 7:
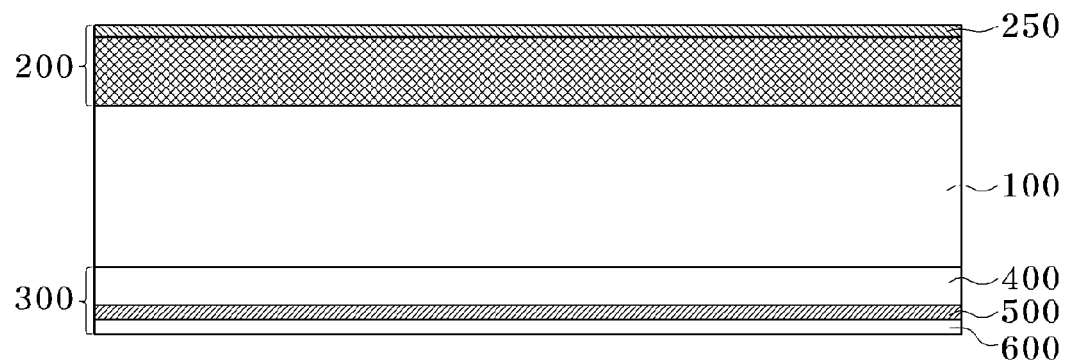
FIGS. 7 through 14 are cross-sectional views illustrating a method of manufacturing an image sensor including a monolithically integrated microlens array according to an exemplary embodiment of the present invention.

Referring to FIGS. 1 and 7, a microlens-forming layer 200 may be formed on one side of a prepared substrate 100 by stacking a semiconductor material layer having a gradually increased oxidation rate. A lower ohmic contact layer 400, an active layer 500, and an upper ohmic contact layer 600 may be sequentially stacked on the other side of the substrate 100, thereby forming a photo-detector forming layer 300 for forming an image sensor (i.e., a photo-detector P).

In this case, a method of forming the photo-detector forming layer 300 is not limited to the above description. The photo-detector forming layer 300 may be formed using any one of various other methods when the used method is applicable to a method of manufacturing an image sensor including a microlens array according to an exemplary embodiment of the present invention.

Here, the substrate 100 may be a semiconductor substrate formed of, for example, GaAs, GaP, InP, InGaAs, sapphire, or GaN, but the present invention is not limited thereto.

Meanwhile, the photo-detector P may be any apparatus, for example, a PD, which may externally receive light and convert the received light into an electric signal.

The microlens-forming layer 200 may include a semiconductor material layer stacked by gradually increasing an oxidation rate as the semiconductor material layer becomes farther from the substrate 100.

For example, the oxidation rate of the semiconductor material layer may depend on the Al composition ratio thereof. The microlens-forming layer 200 may be formed by gradually increasing the Al composition ratio of the semiconductor material layer as the semiconductor material layer becomes farther from the substrate 100.

In this case, a method of forming the microlens-forming layer 200 may be performed using, for example, an analog alloy process or a digital alloy process, but the present invention is not limited thereto. The analog alloy process and the digital alloy process were described above in detail with reference to FIGS. 2 through 4.

Meanwhile, an oxidation barrier layer 250 may be further formed on a top surface of the microlens-forming layer 200 as needed. The oxidation barrier layer 250 may inhibit vertical oxidation of an upper portion of the microlens-forming layer 200 and allow only lateral oxidation of a lateral portion of the microlens-forming layer 200 during subsequent oxidation of the microlens-forming layer 200, thus resulting in formation of a lens shape.

Figure 8:
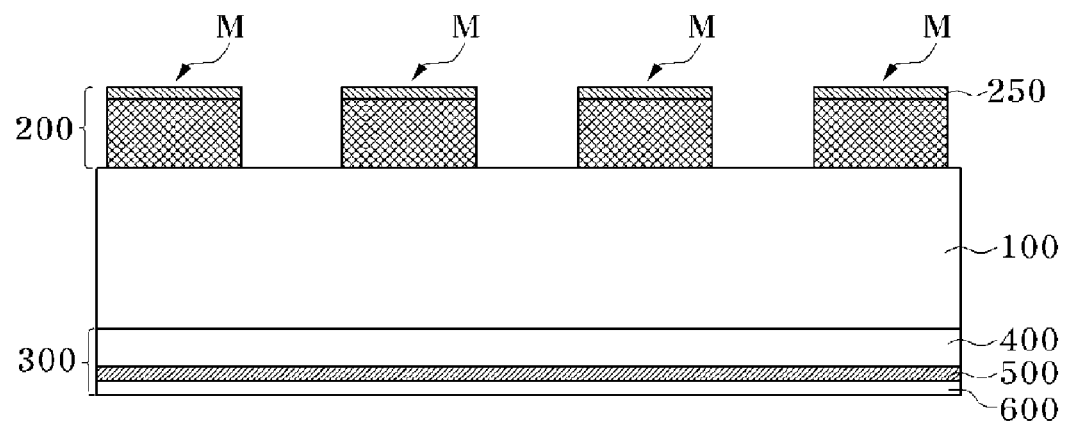

Referring to FIGS. 1 and 8, a predetermined region of the microlens-forming layer 200 may be etched until the substrate 100 is exposed, thereby forming a plurality of mesa structures M required for forming microlenses L. The mesa structures M may be spaced a predetermined distance apart from one another and have exposed lateral surfaces. That is, the microlens-forming layers 200 having the mesa structures M may be formed.

Here, the predetermined region of the microlens-forming layer 200 may be etched using, for example, a photolithography process, but the present invention is not limited thereto.

For example, a method of etching the predetermined region of the microlens-forming layer 200 using a photolithography process will now be described in detail. To begin with, a photoresist layer may be coated on the microlens-forming layer 200.

Subsequently, the photoresist layer may be exposed and developed, thereby forming a photoresist pattern with a predetermined shape in a partial region of the microlens-forming layer 200 to be etched, for example, a region of the microlens-forming layer 200 corresponding to each of regions where the plurality of photo-detectors P will be formed.

In this case, the photoresist pattern may be formed in one of various shapes, for example, a circular shape or a polygonal shape such as a square shape, according to a desired shape of the microlens L.

Thereafter, the exposed microlens-forming layer 200 may be etched using the photoresist pattern as an etch mask, thereby forming a plurality of mesa structures M on the substrate 100.

In this case, the exposed microlens-forming layer 200 may be etched to expose a lateral surface of each of the mesa structures M until a predetermined region of the substrate is exposed.

Figure 9:
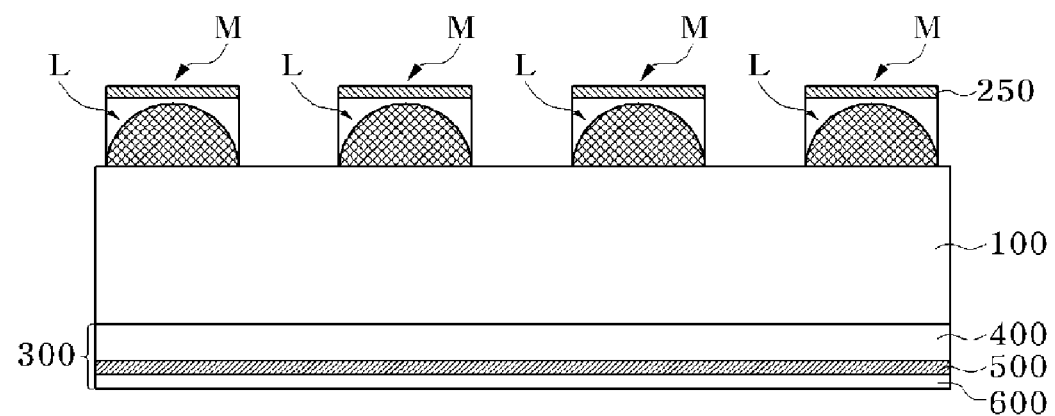
Figure 10:
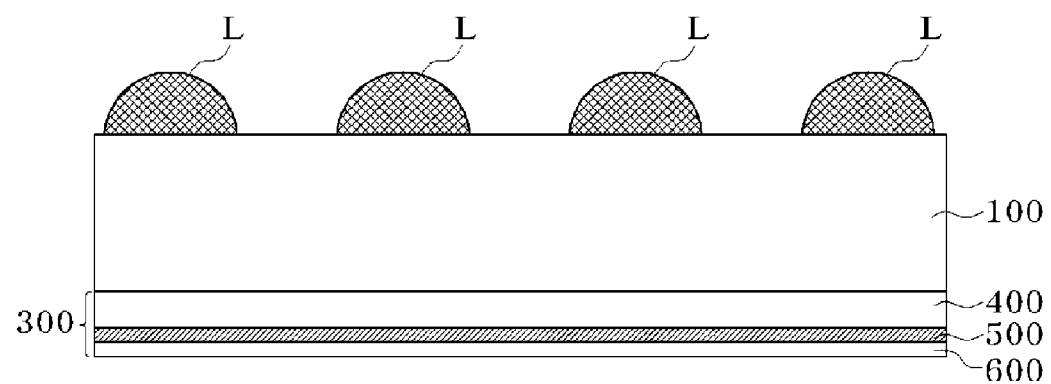

Referring to FIGS. 9 and 10, a lateral surface of each of the mesa structures M may be oxidized, thereby forming a microlens L having a radius of curvature in the center of each of the mesa structures M (i.e., each of the microlens-forming layers 200 having the mesa structures M).

In this case, the oxidation process may be a wet oxidation process performed at a high temperature. Thus, each of the mesa structures M may be oxidized in a lateral direction, thereby enabling the formation of the microlens L without an additional process.

That is, since the oxidation rate of the microlens-forming layer 200 becomes higher as the microlens-forming layer 200 becomes farther from the substrate 100, a rate at which the microlens-forming layer 200 is oxidized may be gradually increased, thereby forming the microlens L at an interface between an oxidized region and an unoxidized region.

Afterwards, as shown in FIG. 10, a process of removing an oxidized semiconductor material from regions other than the microlens L may be further performed on the microlens-forming layer 200 having the microlens L. In this case, for example, when the oxidation barrier layer 250 is formed on the microlens-forming layer 200, the oxidation barrier layer 250 may also be removed. Meanwhile, the wet oxidation process may be performed at a temperature of about 300 to about 500° C. for about 30 to about 200 minutes.

Referring to FIGS. 11 through 14, a plurality of photo-detectors P may be formed on the other side of a substrate 100 having a plurality of microlenses L to respectively correspond to the microlenses L.

The photo-detector P may be formed on the substrate 100 using various known methods.

Figure 11:
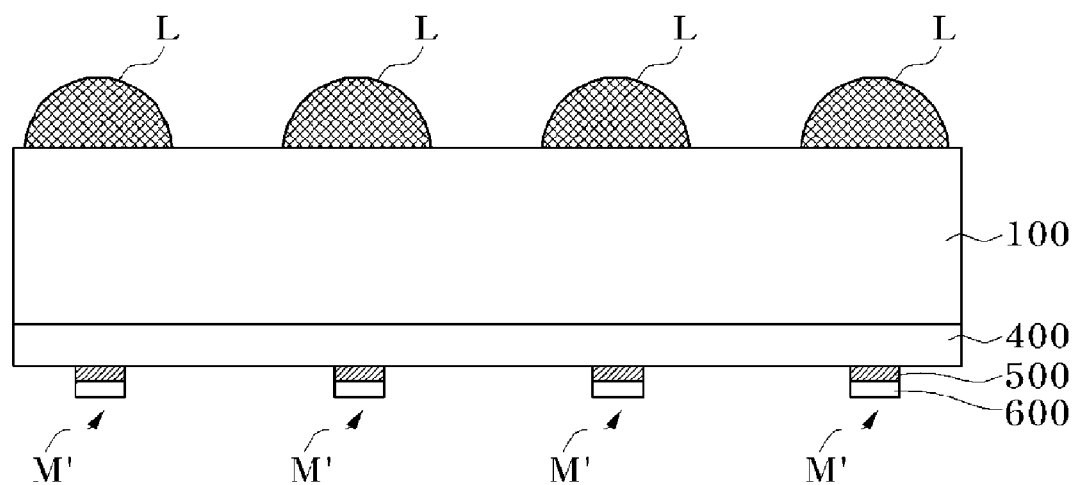

For example, as shown in FIG. 11, a predetermined region of a photo-detector forming layer 300 formed on a substrate 100 may be etched until a lower ohmic contact layer 400 is exposed, thereby forming a plurality of mesa structures M' a predetermined distance apart from one another.

Here, the predetermined region of the photo-detector forming layer 300 may be etched using, for example, a photolithography process, but the present invention is not limited thereto.

Figure 12:
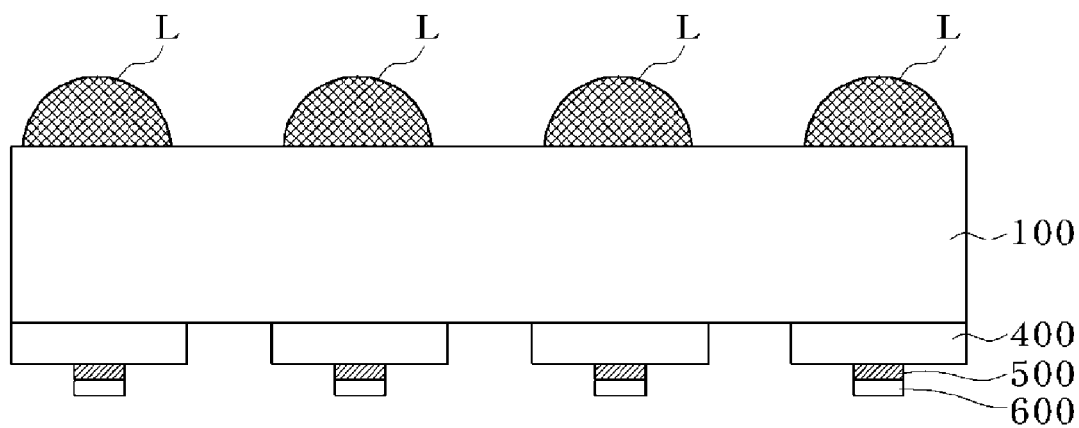

Thereafter, as shown in FIG. 12, the lower ohmic contact layer 400 may be etched until the substrate 100 is exposed, thereby patterning each region required for forming the photo-detector P.

The lower ohmic contact layer 400 formed between two adjacent ones of the plurality of mesa structures M' may be partially etched, thereby patterning regions for a plurality of photo-detectors P corresponding respectively to a plurality of microlenses L.

In this case, the lower ohmic contact layer 400 may be etched using, for example, a photolithography process, but the present invention is not limited thereto.

Figure 13:
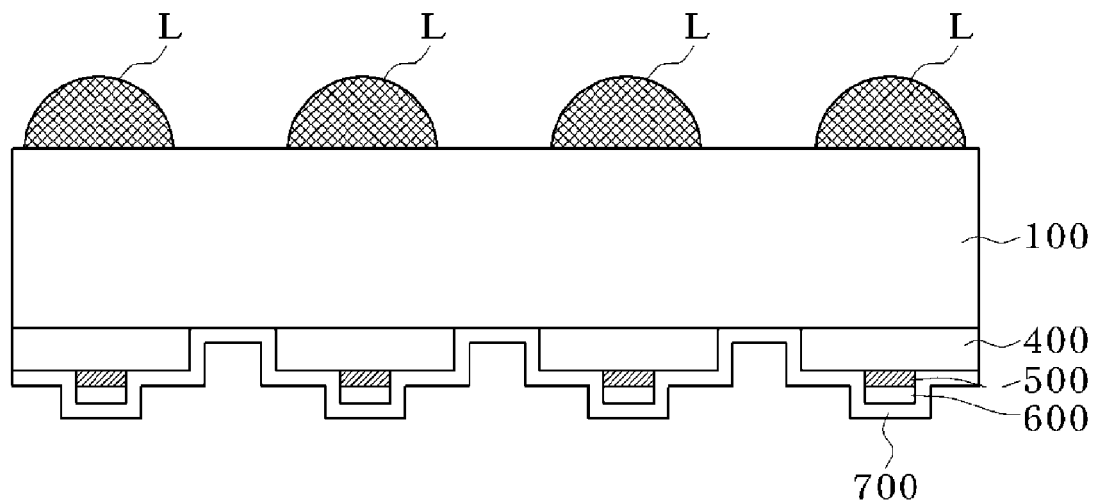
Figure 14:
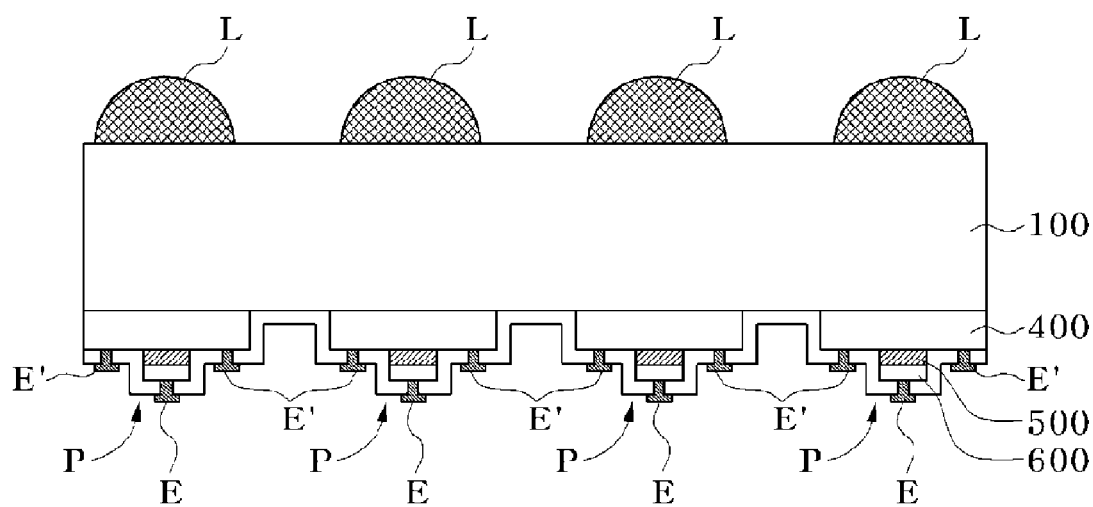

Subsequently, as shown in FIGS. 13 and 14, a passivation layer 700 may be coated on the entire surface of the other side of the substrate including respective regions for forming the plurality of photo-detectors P, and upper and lower electrodes E and E' may be formed in each of the regions for forming the plurality of photo-detectors P.

In this case, the upper and lower electrodes E and E' may be formed by patterning predetermined regions of the passivation layer 700 formed on each of the regions for forming the plurality of photo-detectors P to expose each of the upper and lower ohmic contact layers 500 and 400. Thus, the upper electrode E may be formed on each of exposed regions of the upper ohmic contact layer 500, while the lower electrode E' may be formed on each of exposed regions of the lower ohmic contact layer 400.

The plurality of photo-detectors P may be formed on the substrate 100 using the above-described serial process, but the present invention is not limited thereto. The photo-detectors P may be formed using any one of various other methods as long as the method used is applicable to a method of manufacturing an image sensor including a microlens array according to an embodiment of the present invention.

Figure 15:
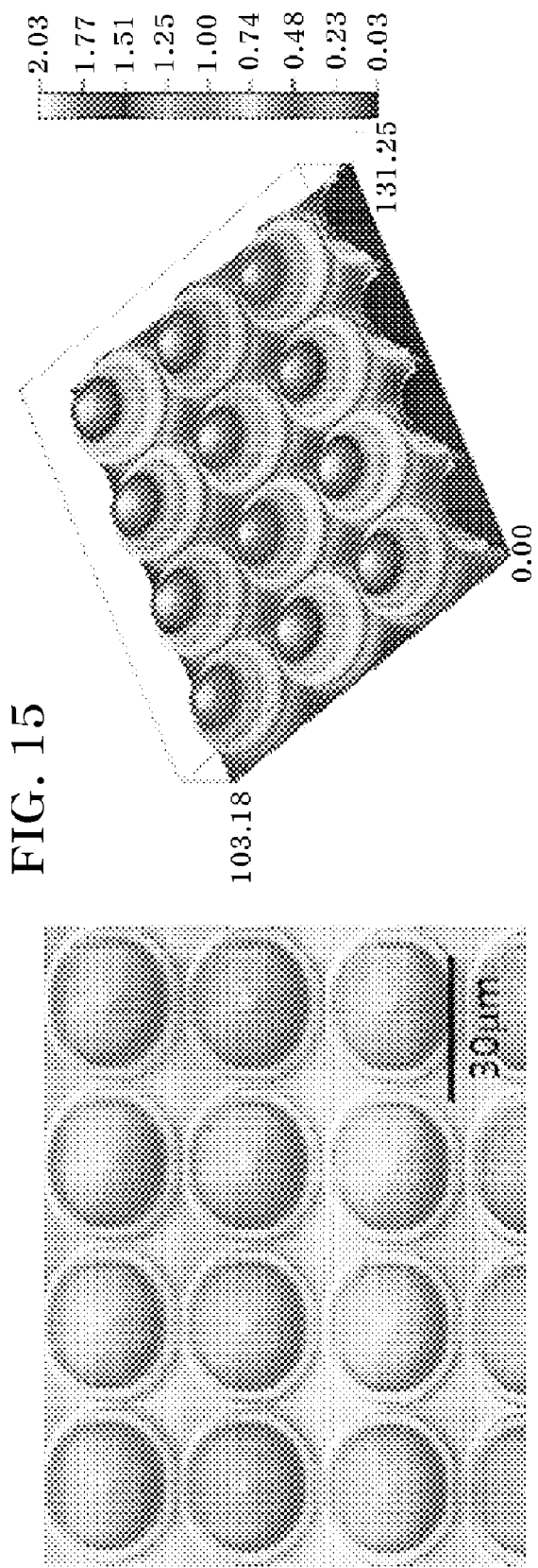
FIGS. 15 and 16 are optical microscopic images of a microlens array manufactured using a method according to an exemplary embodiment of the present invention.
Figure 16:
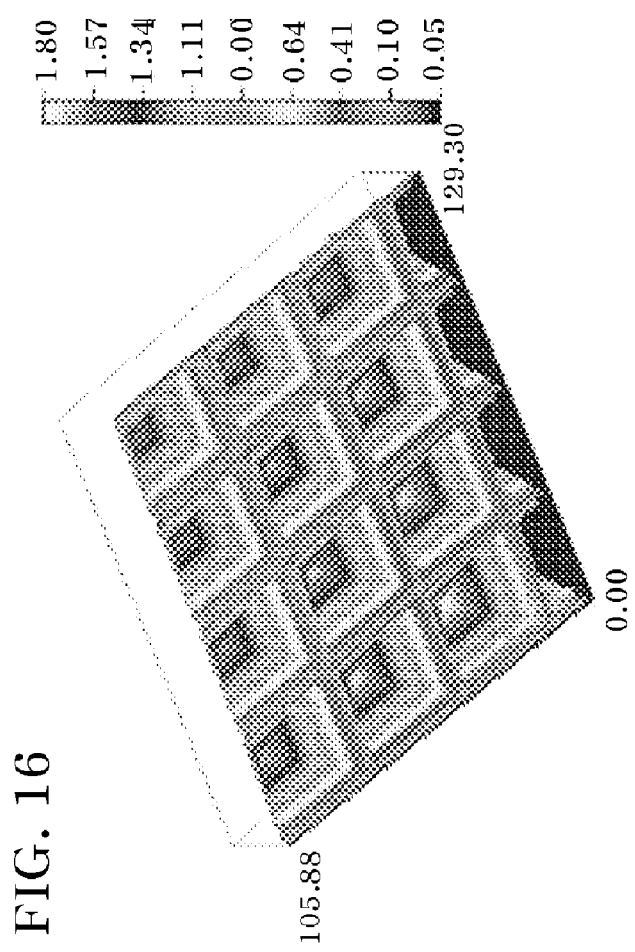
Figure 16:
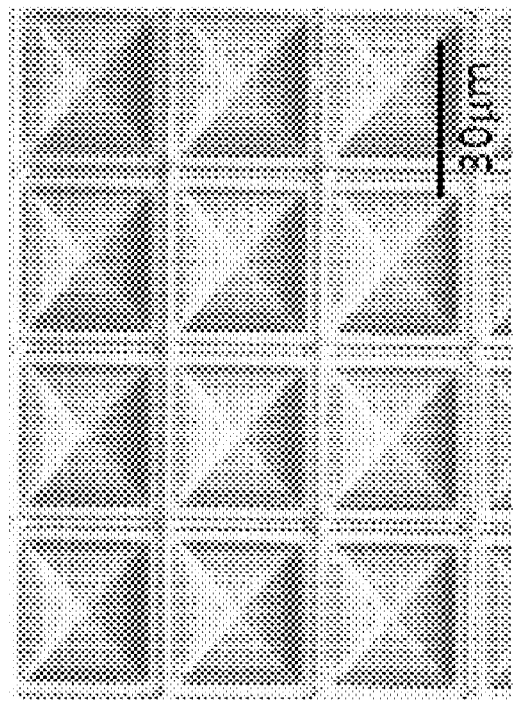

FIGS. 15 and 16 are optical microscopic images of a microlens array manufactured using a method according to an exemplary embodiment of the present invention.

FIG. 15 is an image of a circular microlens array, and FIG. 16 is an image of a square microlens array.

For example, a ratio of the area of a microlens to that of a unit cell of a microlens array may be referred to as a fill factor. In this case, the circular microlens array of FIG. 15 has a fill factor of about 64%, while the square microlens array of FIG. 16 has a fill factor of about 87%.

Accordingly, the square microlens array having a higher fill factor may be adopted to maximize the efficiency of a microlens integrated with the image sensor.

According to an image sensor including a microlens array and a method of manufacturing the same of the present invention as described above, a microlens can be manufactured using a semiconductor material, thereby enabling manufacture of a lens, which may be easily monolithically integrated in an image sensor and have a high NA, and manufacture of a subminiature, high-density, polygonal microlens array.

Furthermore, according to the present invention, a microlens array can be formed in an image sensor so that costs for manufacturing image sensors can be reduced, the SNR and resolution of the image sensors can be increased, and the sensitivity thereof can be improved.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing an image sensor including a microlens array, the method comprising:
   (a) forming a microlens-forming layer on one side of a substrate, wherein the microlens-forming layer comprises a multinary compound semiconductor material whose composition ratio of oxidation element is gradually increased in a direction away from the substrate;
   (b) forming photo-detector forming layer on opposite side of the substrate, the photo-detector forming layer including a lower ohmic contact layer, an active layer, and an upper ohmic contact layer;
   (c) after step (b), forming a plurality of mesa structures by etching a predetermined region of the microlens-forming layer until the substrate is exposed, the plurality of mesa structures spaced a predetermined distance apart from one another and having exposed lateral surfaces, respectively;
   (d) oxidizing a lateral surface of each of the mesa structures and thereafter selectively removing oxidized regions to form microlenses having a radius of curvature in the centers of the respective mesa structures; and,
   (e) forming a plurality of photo-detectors on the opposite side of the substrate to respectively correspond to the microlenses, by performing a process including; a step of selectively etching both of the active layer and the upper ohmic contact layer; a step of selectively etching the lower contact layer to selectively, expose the opposite side of the substrate; and a step of forming a passivation layer on the lower contact layer and the upper ohmic contact layer.

2. The method of claim 1, further comprising, after step (a), forming an oxidation barrier layer on a top surface of the microlens-forming layer.

3. The method of claim 1, wherein, in step (a), the microlens-forming layer is formed using a plurality of different layers,
   wherein each of the plurality of layers includes a digital alloy formed by stacking at least two semiconductor material layers having different oxidation rates, and an oxidation rate of each of the plurality of layers is gradually increased by controlling the thickness of a layer having a highest oxidation rate.

4. The method of claim 1, wherein, in step (a), the microlens-forming layer includes a combination of an Al-containing ternary or quaternary compound and is formed by alternately stacking an Al-containing binary or ternary compound and an Al-free binary or ternary compound.

5. The method of claim 1, wherein, in step (c), each of the mesa structures is formed as a circular or polygonal mesa structure.

6. The method of claim , wherein, in step (d), each of the microlenses is formed in a lens shape having a radius of curvature by exponentially oxidizing the microlens-forming layer in the direction away from the substrate.

7. The method of claim 1, wherein, in step (d), the oxidizing of the lateral surface of each of the mesa structures is performed using a wet oxidation process at a temperature of about 300 to about 500° C. for about 30 to about 200 minutes.

8. The method of claim 1, wherein the composition ratio of the oxidation element is increased from 0.9 to 0.99 in the direction away from the substrate.

9. The method of claim 8, wherein the composition ratio of the oxidizing element is increased linearly, to thereby provide exponential increase in oxidation rate of the microlens-forming layer.

10. The method of claim 1, wherein the substrate comprises a material selected from: GaAs, GaP, InP, InGaAs, GaN, or $Al_2O_3$.

* * * * *